United States Patent [19]

Norton

[11] 4,321,691
[45] Mar. 23, 1982

[54] REDUNDANT BUBBLE DETECTOR
[75] Inventor: Robert H. Norton, Menlo Park, Calif.
[73] Assignee: National Semiconductor Corporation, Santa Clara, Calif.
[21] Appl. No.: 155,337
[22] Filed: Jun. 2, 1980
[51] Int. Cl.³ ............................................. G11C 19/08
[52] U.S. Cl. .......................................... 365/8; 365/16
[58] Field of Search .......................... 365/8, 1, 15, 16

[56] References Cited
U.S. PATENT DOCUMENTS
4,078,230  3/1978  George .................................... 365/8
4,151,601  4/1979  Verhulst ................................ 365/8

Primary Examiner—James W. Moffitt
Attorney, Agent, or Firm—Gail W. Woodward; James A. Sheridan; Neil B. Schulte

[57] ABSTRACT

A magnetic bubble detector stretches a single magnetic bubble domain across two isolated magneto-resistive sensors so that only one of the sensors needs to be functional in order to detect the presence of a magnetic bubble. The magnetic bubble domain can be striped actively by a local field created by a current loop. Alternatively, if the magnetic bubble domain is stretched passively by propagation along a progressively widening pattern of magnetic elements, the pattern can be separated into two isolated patterns, one associated with each sensor, so that only one of the pattern/sensor pairs needs to be functional in order to detect the presence of a magnetic bubble.

An active bubble switch can be used as an alternative to the passive stretch array. The bubble switch is coupled to receive the activating current provided to one the sensors for directing magnetic bubble domains to that sensor in response to the application of an activating current to that sensor.

Finally, the terminals of the magneto-resistive elements are interconnected in such a way as to facilitate testing of the sensors or sensor/pattern pairs and selective disabling of one of the sensors or sensor/pattern pairs. This interconnection provides a redundant bubble detector having a minimum number of external connections which is easy to package, connect, test and use.

4 Claims, 8 Drawing Figures

REDUNDANT BUBBLE DETECTOR

BACKGROUND OF THE INVENTION (1) Field of the Invention

The present invention relates generally to magnetic bubble domain devices. More specifically, the preferred embodiment of the present invention is related to a redundant bubble domain detector for sensing the presence or absence of a magnetic bubble domain in a magnetic bubble domain memory device.

(2) Description of the Prior Art

Magnetic bubble domain memory devices are conventionally made by sandwiching a thin film of magnetic material between two permanently biased magnets. Specifically, epitaxial garnet film is often used as the magnetic material, and the external bias field provided by the magnets is typically 180 Oe. Logical "ones" are represented by the presence of domains of reverse magnetization in this film and logical "zeros" are represented by the absence of the reverse domains. The reverse domains in the epitaxial garnet film, known as bubble domains, are stabilized by the presence of the external bias field created by the two permanent bias magnets. These bubble domains are typically cylindrical in shape, aligned with the external bias field, and approximately 1-5 microns in diameter.

The bubble domains produce a magnetic field above the garnet film surface similar to that of a magnetic dipole. It is by means of this field that the bubble domains can be moved in the plane of the film. Typically, the bubble domains are moved by a method known as field-access propagation. In this method, the garnet film in which the bubble domains occur has thin-film permalloy patterns deposited on it. These patterns lie in the plane of a rotating magnetic field generated by two coils. The changing poles periodically induced in the permalloy patterns by the rotating magnetic field alternately attract and repel the bubbles, causing them to propagate along preselected paths. An asymmetric chevron propagation element is currently regarded as the most desirable permalloy pattern.

In most existing and proposed bubble memory chips, the bubble memory architecture comprises minor loops which operate as shift registers. The bubbles domains recirculate in the minor loops and are generated and detected in input and output tracts. These tracts and the minor loops are organized in different ways to a large extent dictated by the other components. Specifically, present bubble memory architectures are largely a function of the design of the bubble generators, replicators, detectors, and the gates used for transferring or swapping bubble domains in and out of the minor loops.

To detect bubble domains and generate the desired electrical response, an array of permalloy chevron propagation patterns stretches the bubble domain to several hundred times its original diameter. These stretched bubbles, known as stripes, then pass under a magneto-resistive sensing element also made of permalloy. The presence of a stripe changes the magnetic field strength through the permalloy, thereby altering the permalloy's resistance. This change in resistance is detected electronically and provides an indication of the presence or absence of a bubble domain.

Most present bubble memories have a surplus of minor loops to provide a built-in redundancy to insure the high probability of a working memory device in spite of defects in the magnetic material or in the permalloy patterns which cause one or more of the minor loops to be inoperative. However, the detectors and the associated propagation and stretching arrays require a significant fraction of the total chip area as a result of the requirement to stretch the bubbles to a length which is sufficient to be passively detected by magneto-resistive detectors. On memory devices where two or more detectors must function on a single die, the potential of a detector failure creates a high loss in yield of properly functioning devices.

SUMMARY OF THE INVENTION

A magnetic bubble detector provides for stretching a magnetic bubble domain across two isolated magneto-resistor sensors. In accordance with the preferred embodiment of the present invention, a redundant bubble domain detector has an isolation gap dividing an array of passive chevron stretching elements into two arrays, each for propagating a striped bubble domain to one of two independent sensors. The resulting chevron stretcher arrays and sensors are thus isolated from any defects occurring in the other array or sensor. Alternatively, the bubble domains can be stretched across the sensors actively by a current loop. In another alternative embodiment, a bubble switch is coupled to receive the activating current provided to one of the sensors for directing magnetic bubble domains to that sensor in response to the application of an activating current.

Finally, the terminals of the magneto-resistive elements are interconnected in one embodiment in such a way as to facilitate testing and selective disabling of the sensor or sensor/pattern pairs.

DETAILED DESCRIPTION OF THE PREFERRED EMBODIMENT

Figure 1:
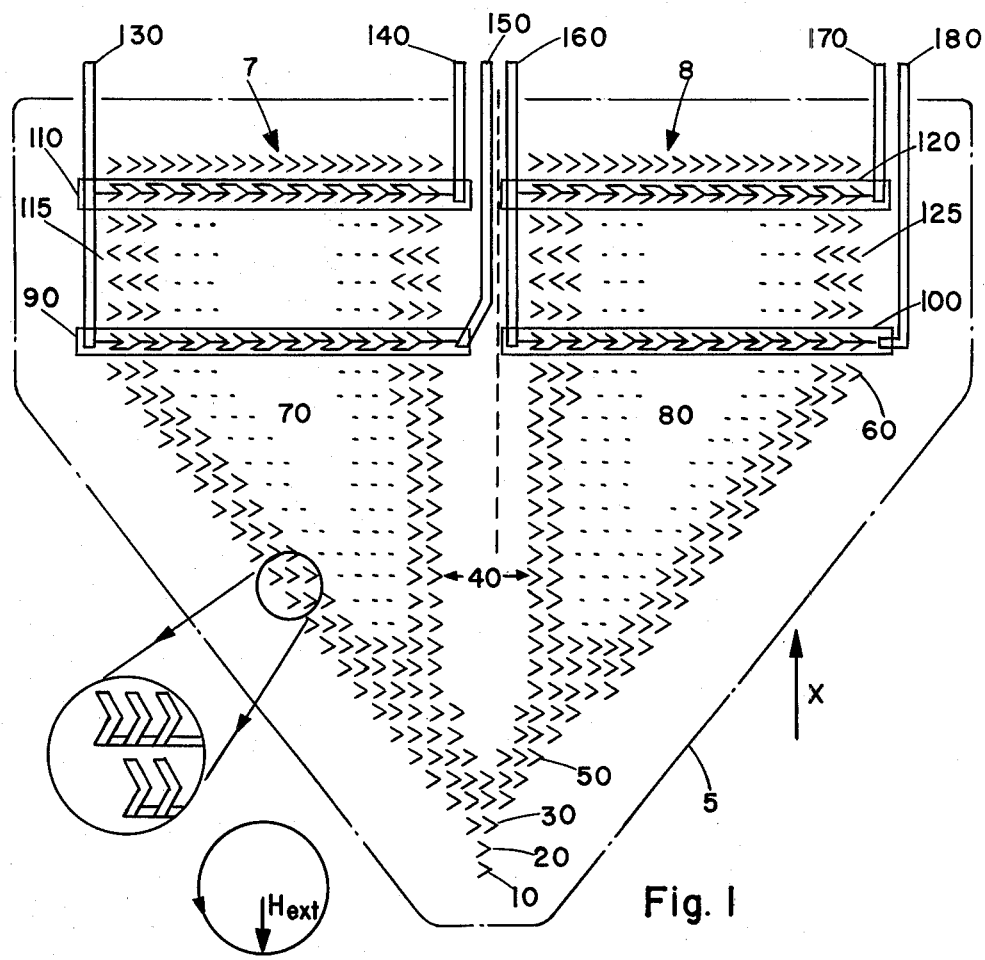
FIG. 1 is a detailed illustration of the permalloy and conductor patterns of a field-access redundant bubble domain detector built in accordance with the present invention.

FIG. 1 is a detailed illustration of a permalloy field-access redundant bubble domain detector 5 constructed in accordance with the preferred embodiment of the present invention. A rotating magnetic field $H_{ext}$ provided by two external coils (not illustrated) causes a bubble domain to propagate from a permalloy chevron 10 to permalloy chevron 20 and to subsequently propagate through the detector in the general direction indicated by the arrow X. As the bubble domain propagates from chevron 20 to chevron row 30, the bubble domain is striped or stretched out across the length of chevron row 30. Similarly, the bubble domain continues to propagate to successively wider chevron rows during subsequent rotations of the magnetic field and to stretch out across them.

Preferably, the cylindrical bubbles have a diameter of approximately 2.2 um. The width of the associated stripes is approximately the same. The gaps between chevrons of adjacent rows are approximately 1.25 um wide. The gaps between chevrons on the same row are approximately 1.6 um wide. Both of these gaps are small enough relative to the dimensions of the bubble domains to facilitate the propagation of bubble domains or stripes thereacross. Preferably, these propagation gaps are approximately ⅔ the bubble diameter. Gaps larger than the bubble diameter can be used; however, they require stronger rotating magnetic field strengths and are otherwise undesirable.

The stretched bubble domain, or stripe, is bridged across an isolation gap 40 which is characterized by an absence of permalloy chevrons. Chevron rows 50 and 60 and the chevron rows therebetween are characterized by this isolation gap and define two distinct bubble stretcher arrays 70 and 80. An enlargement of a portion of the stretcher array 70 on the left side of FIG. 1 illustrates the arrangement of the chevron propagation elements which make up the same. The bubble stretcher arrays 70 and 80 further stretch an individual stripe as it propagates upwardly in FIG. 1. This stripe may bridge across the isolation gap 40, however, at high bias field strengths the stripe may split into two separate stripes. The isolation gap 40 is wide enough to isolate the portion of a split stripe in one stretcher array from the remaining portion of the split stripe and the fields in the other array. Thus defects in one stretcher array do not impede propagation in the other stretcher array, regardless of whether the original stretched bubble splits into two stripe portions or not. Specifically, the local field of a chevron pattern extends a distance approximately equal to the length of a pattern, or 15 um. Further, bubble domains need to be about 5 bubble domain diameters apart to propagate independently. In the preferred embodiment, isolation gap 40 is approximately 20 bubble diameters wide, which is more than wide enough to isolate the stretcher arrays. This separation also simplifies the layout of connections to the detector.

Detector 5 consists of a left detector half 7 and a right detector half 8. Associated with detector half 7 is stretcher array 70, an active sensor 90 and a reference sensor 110. Associated with right detector half 8 is stretcher array 80, an active sensor 100, and a reference sensor 120.

Each half of the original stripe is stretched to a length approximately 600 times the diameter of the original bubble domain, which corresponds to approximately 300 chevron patterns, as it propagates through the 30 rows of the stretcher arrays. The portion of the stripe in area 70 propagates under active magneto-resistive sensor 90. Preferably, magneto-resistive sensor 90 is a serpentine pattern of interconnected permalloy chevrons which has a resistance which varies as a function of the local magnetic field. The local magnetic field is altered by the presence or absence of a bubble domain stripe proximate to the magneto-resistive element. Thus, the resistance of magneto-resistive sensor 90 changes in response to the propagation of a stripe thereunder. Similarly, the portion of the stripe in array 80 is stretched and passes beneath active magneto-resistive element 100.

Associated with active magneto-resistive sensor 90 is reference magneto-resistive sensor 110 which has chevron rows 115 placed on either side of it oriented so as to direct bubble domains away from the reference magneto-resistive sensor and to isolate the reference sensor from the fields associated with bubble domains. Similarly, associated with magneto-resistive sensor 100 is reference magneto-resistive sensor 120 which also has permalloy chevron rows 125 arranged proximate to it so as to propagate bubble domains or stripes away from the reference sensor. This provides a reference resistance for comparison with the resistances of the active sensors.

A terminal 130 is coupled to one end of the reference magneto-resistive sensor 110 and to one end of active magneto-resistive sensor 90. Terminals 140 and 150 are coupled to the other ends of reference magneto-resistive sensor 110 and active magneto-resistive sensor 90 respectively. Similarly, terminal 160 is coupled to one end of reference magneto-resistive sensor 120 and one end of active magneto-resistive sensor 100. Terminal 170 is coupled to the other end of reference magneto-resistive sensor 120 and a terminal 180 is coupled to the other end of active magneto-resistive sensor 100.

In operation, isolator gap 40 between stretcher arrays 70 and 80 acts to isolate defects in one of the stretcher arrays from the other. Specifically, isolator gap 40 causes a stripe portion to propagate and stretch in a substantially normal fashion in one stretcher array in spite of defects in the other stretcher array which prevent normal propagation of a stripe portion in that other stretcher array. Such flaws might be caused by lithographic errors in the permalloy patterns or by defects in the substrate crystalline structure of the magnetic material. Proper operation of the invention does not depend on the bubble domain or strips actually splitting.

Figure 2:
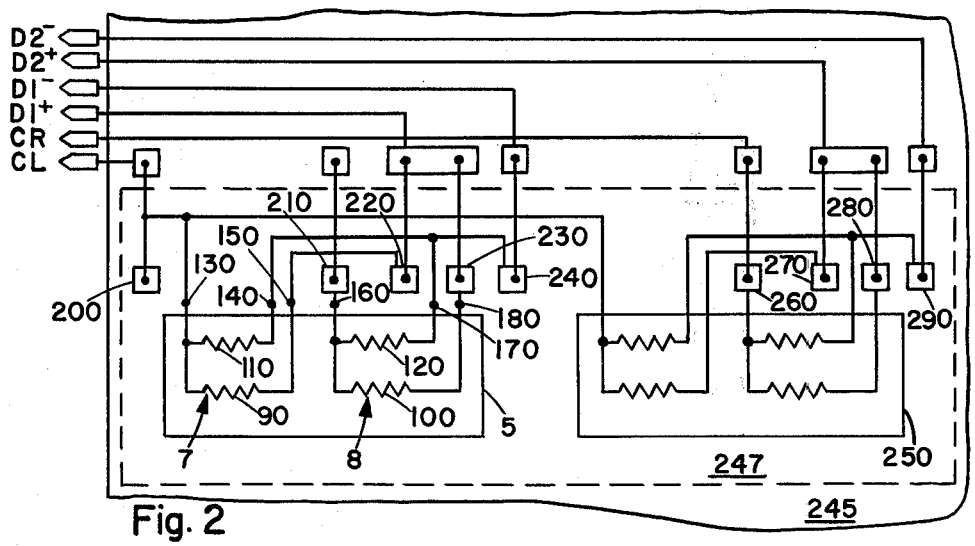
FIG. 2 is a detailed schematic drawing of a circuit coupled to the detector of FIG. 1.

FIG. 2 is a detailed schematic diagram of a circuit illustrating the connection of the preferred embodiment of the present invention. Specifically, FIG. 2 illustrates in detail the interconnections between reference sensors 110 and 120, active sensors 90 and 100, and chip bonding pads and package pins associated with a dual-in-line package (DIP) 245. In the figure, a pair of redundant bubble detectors 5 and 250 are located on a single chip 247. Detector 5 has terminal 130 coupled to a bonding pad 200 and has terminals 140 and 150 coupled to bonding pads 240 and 220 respectively. Terminal 160 is coupled to a bonding pad 210 and output terminals 170 and 180 are coupled to chip bonding pads 240 and 230 respectively. Detector 250 has terminals coupled to bonding pads 260, 270, 280, and 290 in a similar manner.

The present circuit easily adapts to the incorporation of additional redundant bubble detectors, such as detector 250 in the same package as detector 5. For N detectors, only $2N+2$ package pins are required. This is only one more pin than is necessary for nonredundant detectors, which enables the use of redundant detectors without the undesirable addition of many package pins.

The chip bonding pads are in turn connected to the package pins of dual-in-line-package 245. Bonding pad 200 is coupled to pin $C_L$. Bonding pads 210 and 260 are coupled to pin $C_R$. Bonding pads 220 and 230 are coupled to package pin $D_1^+$. Bonding pad 240 is coupled to package pin $D_1^-$. Bonding pads 270 and 280 are coupled to package pin $D_2^+$. Bonding pad 290 is coupled to package pin $D_2^-$.

Figure 3A:
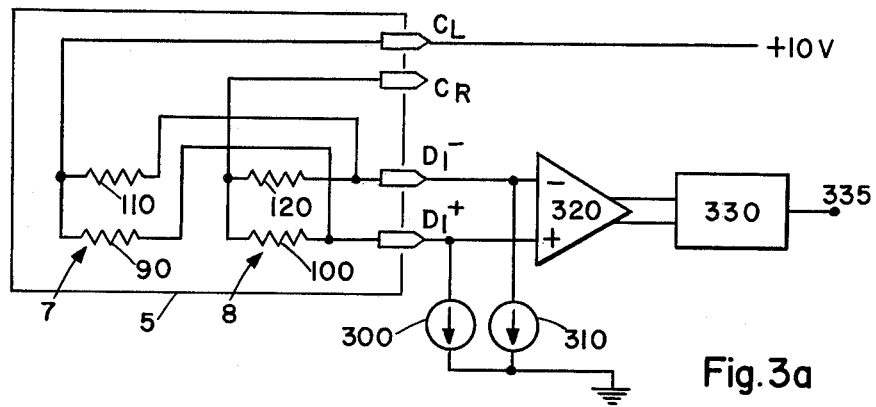
FIGS. 3a and 3b are detailed schematic diagrams of circuits used for testing the left and right halves of the detector of FIG. 1.
Figure 3B:
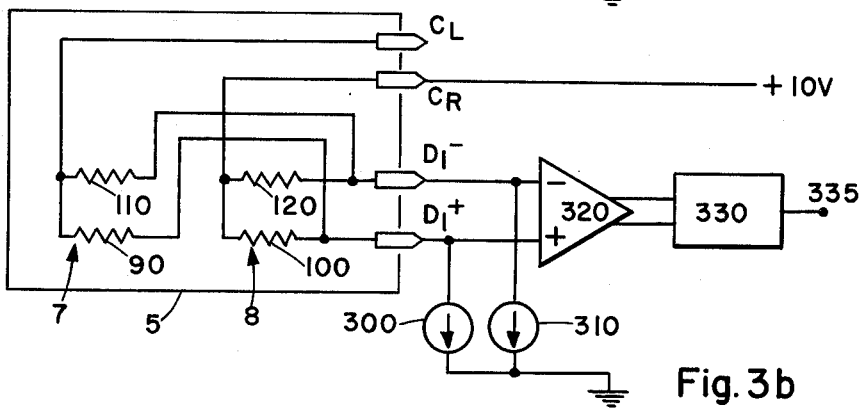

FIGS. 3a and 3b are detailed schematic diagrams of circuits used for testing the redundant bubble detector.

Specifically, FIG. 3a illustrates the circuit for testing left detector half 7 of redundant bubble detector 5 and FIG. 3b illustrates the circuit used for testing right detector half 8 of the same detector.

The testing of left detector half 7 proceeds as follows. Referring to FIG. 3a, a ten (10.0) volt signal is applied to package pin $C_L$. Package pin $C_R$ is left unconnected. Package pins $D_1^-$ and $D_1^+$ are connected to ground through current sources 300 and 310 respectively. Package pins $D_1^-$ and $D_1^+$ are also coupled to negative and positive inputs respectively of a differential amplifier 320. Preferably, current source 300 and 310 each provide currents of 3 ma.

Differential outputs from differential amplifier 320 are connected to sense amplifier 330. Sense amplifier 330 is characterized by a preset threshold voltage $V_{th}$ and provides a logic level "1" signal on output terminal 335 in response to a voltage difference at the input terminals being greater than threshold voltage $V_{th}$, and provides a logic level "0" signal otherwise.

During testing of left detector half 7 a 3 ma current flows through active sensor 90 and a 3 ma current flows through reference sensor 110. Since no current flows through right detector half 8, the voltage difference at package pins $D_1^-$ and $D_1^+$ is determined by the resistances of active sensor 90 and reference sensor 110. A known pattern of magnetic bubble domains is propagated through the detector. These bubble domains alter the resistance of active sensor 90. If the left detector half is operational, it provides the desired differential voltage at output pins $D_1^-$ and $D_2^+$ in response to these bubble domains.

Right detector half 8 is tested in a similar fashion by connecting the ten (10.0) volt signal to package pin $C_R$ and disconnecting package pin $C_L$ as illustrated in FIG. 3b.

Figure 4A:
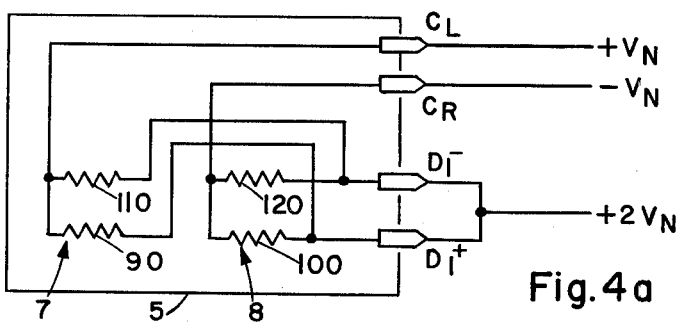
FIGS. 4a and 4b are detailed schematic diagrams of circuits used for disabling the left and right halves of the detector of FIG. 1.
Figure 4B:
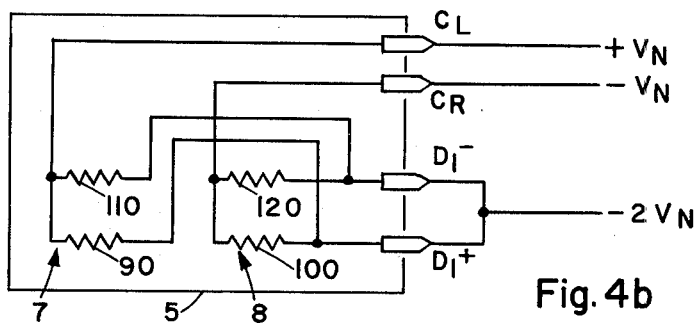

When one half of the detector is tested and found to be functional, the other half of the detector can be disabled so that it will not affect the operation of the detector. Disabling a detector half is accomplished by applying three times the normal operating voltage across the sensors to be disabled. This causes the sensors to overheat and melt, resulting in an open circuit which does not affect the operation of the other detector half. Specifically, FIGS. 4a and 4b illustrate circuits for disabling right detector half 8 and left detector half 7 respectively. Referring to FIGS. 4a and 4b, a voltage $V_N$ is applied to package pin $C_L$ and a voltage $-V_N$ is applied to package pin $C_R$. The right detector half 8 is disabled by applying a voltage of $+2V_N$ to package pins $D_1^+$ and $D_1^-$ as illustrated in FIG. 4a. This causes a current to flow through the permalloy sensors of right detector half 8 which is sufficient to disable the sensors in that half. The current through the left detector half 7 never exceeds the normal operating current, thus the sensors in that half are not affected.

Similarly, left detector half 7 is disabled by applying a voltage of $-2V_N$ to package pins $D_1^-$ and $D_1^+$ as illustrated in FIG. 4b.

Figure 5:
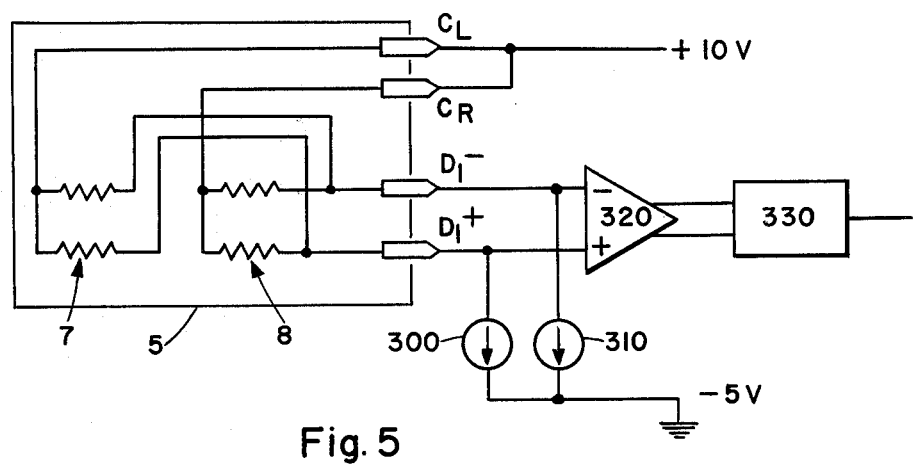
FIG. 5 is a detailed schematic diagram illustrating the detector of FIG. 1 coupled for operation in a bubble memory circuit.

FIG. 5 is a detailed schematic diagram of a redundant bubble detector 5 coupled for operation in a bubble memory device. After testing and disablement of one of the detector halves, the detector can be used for the detection of bubble domains regardless of defects in one of the detector halves. That is, detector redundancy is invisible to the user. Specifically, package pins $C_L$ and $C_R$ are coupled together and coupled to a common power supply.

Although the preferred embodiment describes a thick magneto-resistive film in a serpentine pattern used in the passive detection of bubble domains, the interconnect circuitry described can be used with active thin film magneto-resistive detectors. Specifically, thin film detectors are utilized in circuits having small bubble domains requiring the use of active stretchers (not illustrated in the drawings). These small bubble domains, that is, bubble domains having diameters of one micron or less, do not stretch well passively. Typically, small bubble domains are stretched actively by providing a current pulse of approximately 200 milliamps through a current loop (not illustrated in the drawings) proximite to a thin film magneto-resistive sensor. Thus, an active stretcher can be used to replace the stretcher arrays 70 and 80 of detector 5. However, by providing redundant active sensors along a single active stretcher, a redundant detector can be constructed by coupling active and reference sensors as illustrated in FIGS. 2-5.

Further, another alternative embodiment eliminates the use of reference magneto-resistive sensors by the use of a more complex external sense amplifier. The interconnection, testing, programming and operation are the same as described above with the deletion of reference sensors 110 and 120, associated bond pad 240 and package pin $D_1^-$.

Figure 6:
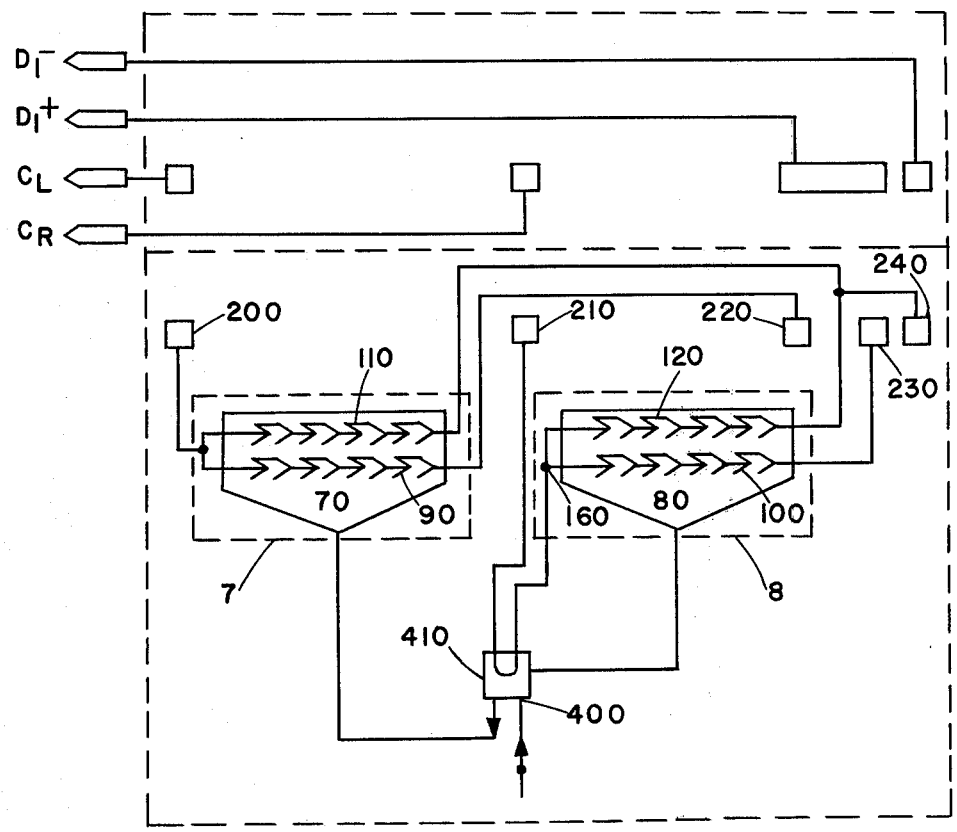
FIG. 6 is a detailed schematic diagram of a detector having a bubble switch for selectivity directing magnetic bubble domains to one of two sensors.

Yet another alternate embodiment is illustrated in FIG. 6. A bubble switch 410 is a swap-gate or transfer gate such as is used in the minor loops of conventional bubble memories. Bubble switch 410 is coupled in series between coupling pad 210 and terminal 160 such that the bubble switch is activated in response to an operating current flowing through right detector half 8. If an operating current, preferably about 6-8 ma, flows through bubble switch 410, a bubble domain appearing at input port 400 is propagated to stretcher array 80. If no current flows through bubble switch 410, which indicates that right detector half 8 is disabled, the bubble domains appearing at input port 400 are propagated to stretcher array 70 of left detector half 7. Each detector half is a conventional magneto-resistive bubble detector similar to the detector halves of FIG. 2 and incorporate chevron-array passive stretcher arrays; however, the magnetic bubble domains are selectively switched to one or the other of the detector halves rather than nonselectively propagated through both. Thus, a redundant detector is provided which requires no additional package pins for the switching function. Further, the user is not affected by the redundancy or choice of detector halves.

While various embodiments of the redundant bubble detector have been illustrated and described, it will be apparent to those skilled in the art that my invention permits of further modification in both arrangement and detail. Therefore, the protection afforded my invention should be limited only in accordance with the scope of the following claims.

I claim:

1. In a device for propagating magnetic bubble domains,
first and second means for separately stretching magnetic bubble domains propagated thereto;
first and second active magneto-resistive sensors positioned adjacent the first and second stretching means, respectively, and adapted for having a normal operating signal applied thereto for detecting magnetic bubble domains stretched by the first and second stretching means, respectively, and further adapted to be selectively permanently disabled by applying a predetermined destruct signal thereto;

first and second reference magneto-resistive sensors connected to the first and second active magneto-resistive sensors, respectively, the reference magneto-resistive sensors being isolated from the stretching means;

first and second bubble propagation paths having adjacent input ends and having output ends connected to the first and second stretching means, respectively;

a third bubble propagation path having an input end and having an output end positioned adjacent the input ends of the first and second bubble propagation paths; and a gate having a control conductor connected to the first active magneto-resistive sensor for transferring magnetic bubble domains from the third bubble propagation path to the first bubble propagation path when the operating signal is applied to the first active magneto-resistive sensor and for transferring magnetic bubble domains from the third bubble propagation path to the second bubble propagation path when the first active magneto-resistive sensor has been disabled.

2. The invention of claim 1 wherein the control conductor is also connected to the first reference magneto-resistive sensor, the first and second reference magneto-resistive sensors are adapted for having the normal operating signal applied thereto for generating reference signals and further adapted to be selectively permanently disabled by applying the predetermined distruct signal thereto, the gate transfers magnetic bubble domains from the third bubble propagation path to the first bubble propagation path when the operating signal is applied to the first active magneto-resistive sensor and the first reference magneto-resistive sensor, and the gate transfers magnetic bubble domains from the third bubble propagation path to the second bubble propagation path when the first active magneto-resistive sensor and the first reference magneto-resistive sensor have been disabled.

3. The invention of claim 1 wherein the first and second magnetic bubble domain stretching means each comprise an array of bubble propagation elements for elongating the shape of a magnetic bubble domain.

4. The invention of claim 1 and further comprising a plurality of rows of bubble propagation elements for isolating the reference magneto-resistive sensors from the stretching means.

* * * * *